United States Patent [19]
Hsu et al.

[11] Patent Number: 5,942,776
[45] Date of Patent: Aug. 24, 1999

[54] SHALLOW JUNCTION FERROELECTRIC MEMORY CELL AND METHOD OF MAKING THE SAME

[75] Inventors: Sheng Teng Hsu; Jong Jan Lee, both of Camas, Wash.

[73] Assignees: Sharp Laboratories of America, Inc., Camas, Wash.; Sharp Kabushiki Kaisha, Osaka, Japan

[21] Appl. No.: 08/869,534

[22] Filed: Jun. 6, 1997

Related U.S. Application Data

[63] Continuation-in-part of application No. 08/812,579, Mar. 7, 1997, Pat. No. 5,731,608.

[51] Int. Cl.⁶ .................................................. H01L 21/8242
[52] U.S. Cl. ............................... 257/295; 257/256; 438/3; 438/957
[58] Field of Search ................................ 438/3, 275, 957, 438/136, 186, 188, 238–240, 250–256, 381, 393–399; 257/287, 281, 256, 261, 295

[56] References Cited

U.S. PATENT DOCUMENTS

| | | | |
|---|---|---|---|
| 3,832,700 | 8/1974 | Wu et al. | 340/173.2 |
| 4,419,809 | 12/1983 | Riseman et al. | 29/591 |
| 5,070,029 | 12/1991 | Pfiester et al. | 437/29 |
| 5,138,406 | 8/1992 | Calviello . | |
| 5,300,799 | 4/1994 | Nakamura et al. | 257/295 |
| 5,303,182 | 4/1994 | Nakao et al. | 365/145 |
| 5,345,415 | 9/1994 | Nakao et al. | 365/145 |
| 5,365,094 | 11/1994 | Takasu | 257/295 |
| 5,373,462 | 12/1994 | Achard et al. | 365/145 |
| 5,416,735 | 5/1995 | Onishi et al. | 365/145 |
| 5,424,238 | 6/1995 | Sameshima . | |
| 5,431,958 | 7/1995 | Desu et al. | 427/255.3 |
| 5,446,688 | 8/1995 | Torimaru | 365/145 |

FOREIGN PATENT DOCUMENTS

| | | |
|---|---|---|
| 4-256361 | 9/1992 | Japan . |
| 8-293565 | 11/1996 | Japan . |
| WO 96/13860 | 5/1996 | WIPO . |

OTHER PUBLICATIONS

Article entitled, Characteristics of NDRO Ferroelectric FETs with a Poly–Si Floating Gate, by T. Nakamura, Y. Nakao, A. Kamusawa and H. Takasu, published in 1995 IEEE proceedings, Aug., 1994, pp. 345–347, #XP000553149.

Jiang et al. "A New Electrode Technology for High–Density Nonvolatile Ferroelectric ($SrBi_2Ta_2O_9$) Memories", IEEE 1996 Symposium on VLSI Technology Digest of Technical Papers, pp. 26–27, 1966.

*Primary Examiner*—Jey Tsai
*Attorney, Agent, or Firm*—David C. Ripma; Gerald Maliszewski

[57] ABSTRACT

A method of forming a FEM cell semi-conductor structure includes forming a device area for the ferroelectric memory (FEM) gate unit on a silicon substrate. Appropriate impurities are implanted into the device area to form conductive channels, for use as a source junction region, a gate junction region and a drain junction region. A FEM cell includes a FEM gate unit formed on the substrate. A gate junction region is formed between the source junction region and the drain junction region for the FEM gate unit on the FEM gate unit device area, which FEM gate unit includes a lower metal layer, a ferroelectric (FE) layer, and an upper metal layer. A shallow junction layer is formed between the FEM gate unit and the gate junction region, as another conductive channel. The FEM gate unit is spaced apart from the source region and the drain region, as is the conductive channel between the FEM gate unit and the gate junction region. Formation of the various conductive channels may take place at various stages of the manufacture, depending on what other devices are built on the substrate, and depending on the efficiencies of the various orders of construction. The structure of the FEM cell semiconductor includes a substrate, which may be a bulk silicon substrate or an SOI-type substrate. Conductive channels of a first and a second type are located on the substrate.

17 Claims, 4 Drawing Sheets

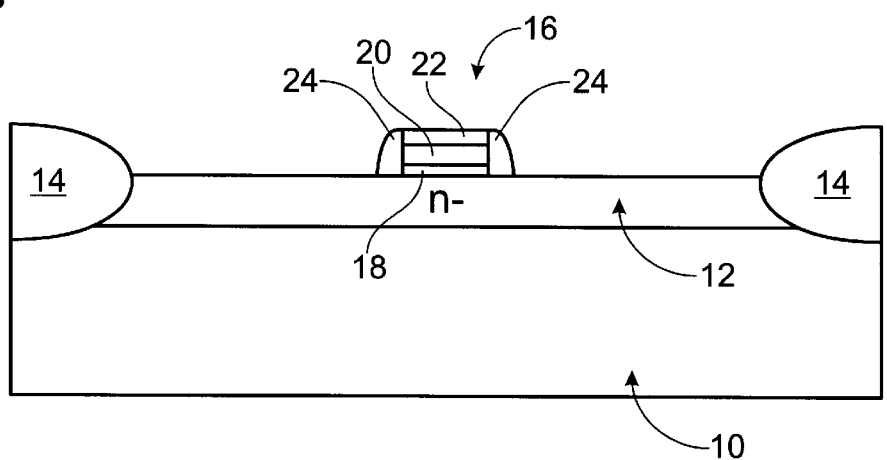
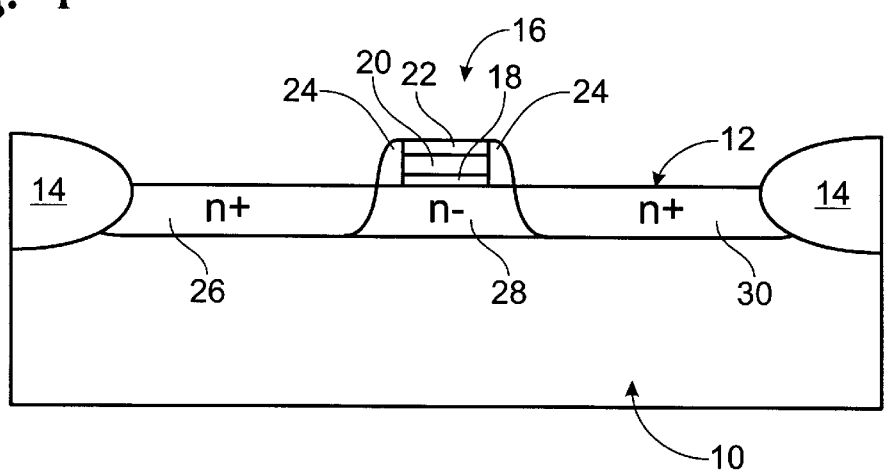

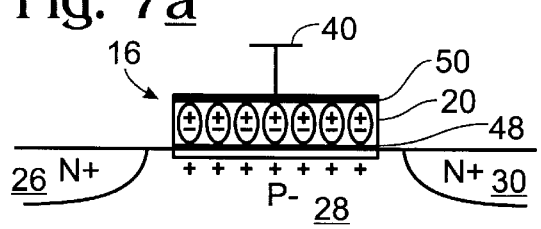
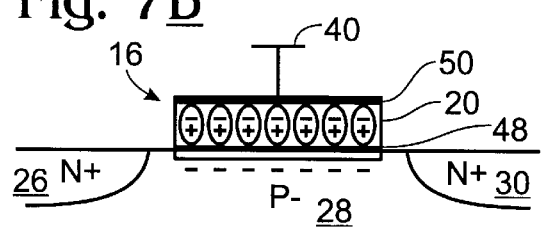
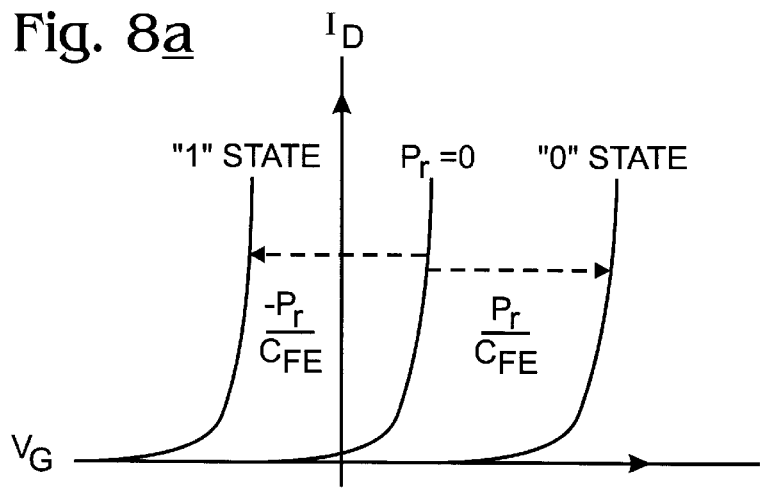
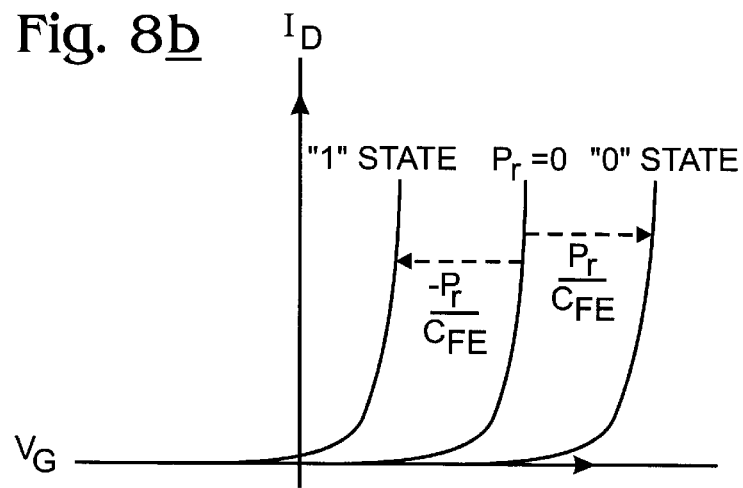

SHALLOW JUNCTION FERROELECTRIC MEMORY CELL AND METHOD OF MAKING THE SAME

RELATED APPLICATION

This application is a continuation-in-part of application Ser. No. 08/812,579, filed Mar. 7, 1997, U.S. Pat. No. 5,731,608 of Hsu et al., for ONE TRANSISTOR FERROELECTRIC MEMORY CELL AND METHOD OF MAKING THE SAME.

BACKGROUND OF THE INVENTION

This application relates to ferroelectric thin films which are used in nonvolatile memories and specifically to a shallow junction metal-ferroelectric-metal-silicon semiconductor. Known ferroelectric random access memories (FRAM) are constructed with one transistor (1T) and one capacitor (1C). The capacitor is generally made by sandwiching a thin ferroelectric film between two conductive electrodes, which electrodes are usually made of platinum. The circuit configuration and the read/write sequence of this type of memory are similar to that of conventional dynamic random access memories (DRAM), except that no data refreshing is necessary in a FRAM. Known FRAMs have a fatigue problem that has been observed in the ferroelectric capacitor, which is one of the major obstacles that limit the viable commercial use of such memories. The fatigue is the result of a decrease in the switchable polarization (stored nonvolatile charge) that occurs with an increased number of switching cycles. As used in this case, "switching cycles" refers to the sum of reading and writing pulses in the memory.

Another known use of ferroelectric thin films in memory applications is to form a ferroelectric-gate-controlled field effect transistor (FET) by depositing the ferroelectric thin film directly onto the gate area of the FET. Such ferroelectric-gate controlled devices have been known for some time and include devices known as metal-ferroelectric-silicon (MFS) FETs. FRAMs incorporating the MFS FET structure have two major advantages over the transistor-capacitor configuration: (1) The MFS FET occupies less surface area, and (2) provides a non-destructive readout (NDR). The latter feature enables a MFS FET device to be read thousands of times without switching the ferroelectric polarization. Fatigue, therefore, is not a significant concern when using MFS FET devices. Various forms of MFS FET structures may be constructed, such as metal ferroelectric insulators silicon (MFIS) FET, metal ferroelectric metal silicon (MFMS) FET, and metal ferroelectric metal oxide silicon (MFMOS) FET.

There are a number of problems that must be overcome in order to fabricate an efficient MFS FET device. The first problem is that it is difficult to form an acceptable crystalline ferroelectric thin film directly on silicon. Such structure is shown in U.S. Pat. No. 3,832,700. Additionally, it is very difficult to have a clean interface between the ferroelectric material and the silicon. Further, there is a problem retaining an adequate charge in the ferroelectric material. A FEM structure on a gate region is shown in U.S. Pat. No. 5,303,182, which emphasizes that the transfer of metal ions into the gate region is undesirable. Similar structure is shown in U.S. Pat. No. 5,416,735.

It is an object of this invention to overcome the aforementioned problems.

Another object of the invention is to provide an MFS FET device which provides a non-destructive readout.

Yet another object of the invention to provide an MFS FET device that occupies a relatively small surface area.

A further object of the invention is to provide an MFS FET device which requires a relatively low programming voltage.

Yet another object of the invention is to provide an FEM gate unit which overlies a shallow junction p⁻ layer, which p⁻ layer extends beyond the margins of the FEM gate unit.

The method of forming the FEM cell semi-conductor structure of the invention includes forming a device area for the ferroelectric memory (FEM) gate unit on a silicon substrate. Appropriate impurities are implanted into the device area to form conductive channels, for use as a source junction region, a gate junction region and a drain junction region. A FEM cell includes a FEM gate unit formed on the substrate. A gate junction region is formed between the source junction region and the drain junction region for the FEM gate unit on the FEM gate unit device area, which FEM gate unit includes a lower metal layer, a ferroelectric (FE) layer, and an upper metal layer. A shallow junction layer is formed between the FEM gate unit and the gate junction region, as another conductive channel. The FEM gate unit is spaced apart from the source region and the drain region, as is the conductive channel between the FEM gate unit and the gate junction region. Formation of the various conductive channels may take place at various stages of the manufacture, depending on what other devices are built on the substrate, and depending on the efficiencies of the various orders of construction.

The structure of the FEM cell semiconductor includes a substrate, which may be a bulk silicon substrate or an SOI-type substrate. Conductive channels of a first and a second type are located above the substrate. A FEM gate unit is located above a channel region, wherein the FEM gate unit includes a lower metal layer, an FE layer, and an upper metal layer. A conductive channel of a third type is located between the FEM gate unit and the channel region. The FEM cell may be constructed in series with a conventional MOS transistor.

These and other objects and advantages of the invention will become more fully apparent as the description which follows is read in conjunction with the drawings.

BRIEF DESCRIPTION OF THE DRAWINGS

FIG. 3 depicts the FEM gate unit constructed on the substrate and surrounded by an insulating region.

FIG. 4 depicts the FEM gate unit of the invention on the substrate with the source, gate and drain regions formed.

FIGS. 7A–7B depict the basic operation principle for the MFS FET devices of the invention.

FIGS. 8A–8B are a graph of $I_p$ vs. $V_G$ for the FEM gate unit of the invention.

DETAILED DESCRIPTION OF THE PREFERRED EMBODIMENTS

The ferroelectric memory (FEM) cell of the invention may be formed on a SOI (SIMOX) substrate, or, it may be formed in a bulk silicon substrate. The description herein will concentrate on the formation of the FEM gate unit on a bulk silicon substrate. It should be appreciated that in some embodiments of the FEM gate unit, a MOS transistor is fabricated simultaneously with the ferroelectric memory cell by conventional means which are well known to those of ordinary skill in the art. Accordingly, for the sake of clarity, the drawings do not depict the formation of the MOS transistor.

Figure 1:
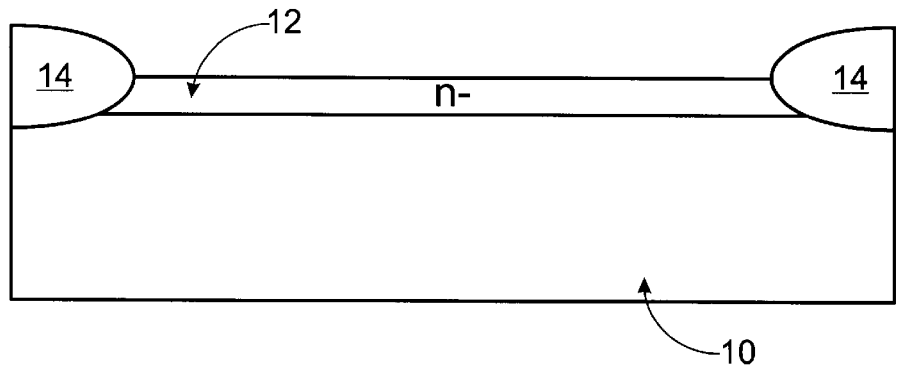
FIG. 1 depicts the substrate and an active region used for the FEM cell of the invention.

Turning now to FIG. 1, a silicon substrate is depicted at 10. Substrate 10, in the preferred embodiment is a single-crystal substrate, and is formed of bulk silicon. Other embodiments may be formed on a SOI substrate. As used herein, "silicon substrate" refers to either a bulk silicon substrate or a SOI substrate, or to any other suitable silicon-based substrate. As depicted in FIG. 1, substrate 10 has been partially etched to the configuration depicted, and a portion of the substrate has been lightly doped to form an active region, or device area, 12, which provides a desired background polarity, in this case, that of an $n^-$ region, referred to herein as a conductive channel of a first type. Active region 12 is bounded by an insulating region 14, formed of $SiO_2$. As is well known to those of a skill in the art, a multiplicity of such regions are formed on the surface of a silicon wafer. For the FEM gate unit of the invention, the cells are arranged in a perpendicular grid to form a memory array.

Using a bulk CMOS substrate as an example to explain the fabrication process, the initial step is to fabricate $n^-$ well and $p^-$ well structures, isolate these structures, and implant appropriate ions to provide threshold voltage adjustment for the transistors. Photoresist is used to mask sections of the wafer. Next, phosphorous ions, also referred to herein as doping impurities of a first type, are implanted at an energy of between 30 keV to 120 keV, with a dose of $1.0\times10^{12}$ cm$^{-2}$ to $5.0\times10^{13}$ cm$^{-2}$ to the $p^-$ well where the FEM gate units are to be constructed. Multiple implantation steps, and/or thermal diffusion may be required to obtain an optimum donor distribution in the $n^-$ layer. The photoresist is stripped away. The implanted $n^-$ type silicon layer may also be replaced with a selective epitaxial growth of silicon with a thickness of 100 nm to 1000 nm.

Figure 2:
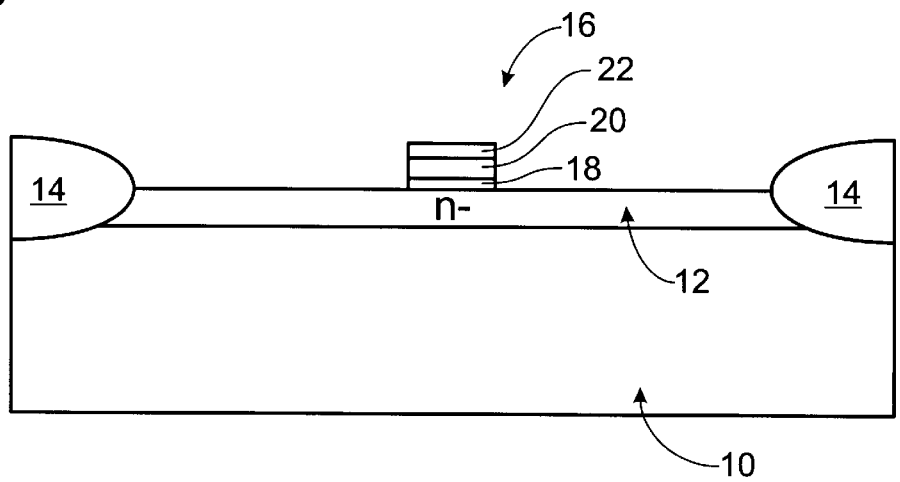
FIG. 2 depicts the substrate having a FEM gate unit formed thereon.

At this point, formation of the FEM gate unit may begin. Referring now to FIG. 2, a FEM gate unit is identified generally at 16 and includes a lower metal layer, or electrode, 18, the ferroelectric (FE) material 20, and a upper metal layer, or electrode, 22. The construction of FEM gate unit 16 begins with the deposition of the lower electrode on active region 12. Lower electrode 18 may be formed of Pt, Ir, $IrO_2$, or an alloy of Pt/Ir, or other suitable conductive material. The thickness of this metal is 20 nm to 100 nm, in the preferred embodiment.

Ultimately, a $p^-$ layer will be formed between FEM gate unit 16 and the gate junction region. The $p^-$ layer may be formed by implanting B or $BF_2$ ions into the surface of the conducting channel of the first type, or into lower electrode 18. Boron ions may be implanted at an energy of 3 keV to 10 keV, while $BF_2$ ions are implanted with an energy level of between 15 keV and 50 keV. Ion concentration in both instances are in the range of $1\cdot10^{11}$ cm$^{-2}$ to $1\cdot10^{13}$ cm$^{-2}$. During an annealing step, described later herein, the implanted ions will diffuse into an $n^-$ gate junction region, to form a $p^-$ layer, referred to herein as a conductive channel of a third type.

Next, the FE material is deposited by chemical vapor deposition (CVD), after appropriate masking. The FE material may be any of the following: $Pb(Zr, Ti)O_3$ (PZT), $SrBi_2Ta_2O_9$ (SBT), $Pb_5Ge_3O_{11}$, $BaTiO_3$, or $LiNbO_3$. The preferred compounds are, in order of preference, $Pb_5Ge_3O_{11}$, SBT and PZT. Most of the experimental work in the FEM gate unit field has been done on PZT compounds. The FE material 20 is deposited to a thickness of 50 nm to 400 nm.

The upper electrode 22 is then formed over the FE material. The upper electrode may be formed of the same materials as the lower electrode, to a thickness of 20 nm to 200 nm. Photoresist is applied over the FEM gate unit, and the cell is then etched to the proper configuration and size. It should be appreciated that the three layers of the FEM gate unit need not be precisely aligned as shown, as their shape may be formed by applying a photoresist, and etching, with masks that have different geometries. However, for the sake of clarity, the FEM gate unit is depicted as a structure which has contiguous, aligned sidewalls.

A layer of $TiO_x$, $Si_3N_4$, or other suitable barrier insulation material, 24, as shown in FIG. 3, is formed by CVD to protect the FEM gate unit. The barrier insulation material is etched to form the sidewall insulator for the gate electrode.

Turning now to FIG. 4, active region 12 may be seen to have been modified to a source region 26, a gate region 28, a drain region 30. These regions are formed by implanting the appropriate ions, also referred to herein as doping impurities of a second type, in the remainder of active region 12 to form two $n^+$ layers, also referred to herein as conductive channels of a second type, which will serve as source region 26 and drain region 30. Appropriate ion implantation in this instance may be the implantation of As ions at a preferred energy of about 50 keV, although implantation in a range of 40 keV to 70 keV is acceptable, and a dosing in a range of $1\cdot10^{15}$ cm$^{-2}$ to $5\cdot10^{15}$ cm$^{-2}$. Alternately, phosphorus ions may be implanted in an energy range of 30 keV–60 keV in the same dosing range.

Figure 5:
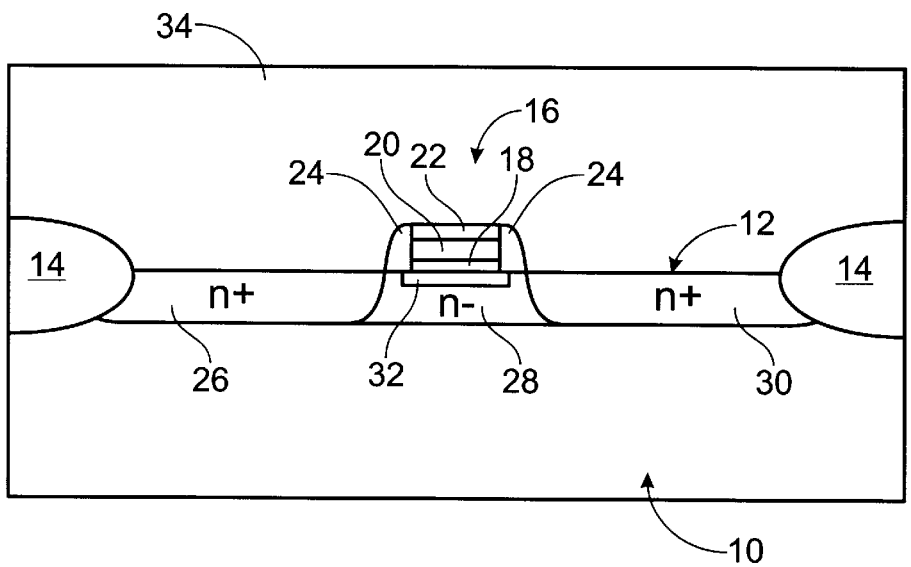
FIG. 5 depicts the FEM cell of the invention having a shallow junction layer formed under the FEM gate unit.

Referring now to FIG. 5, the wafer is heat treated to activate and diffuse the implanted ions, both in the source region and drain region, and in the lower electrode. Diffusion of the ions implanted in lower electrode 18 results in the formation of a shallow junction 32 under FEM gate unit 16, which is the conductive channel of a third type. Temperature range for the heat treatment is in the range of 500° C. to 1100° C., to allow passivation and diffusion of the implanted ions. A layer 34 of $SiO_2$ is then formed over the structure by CVD, or, other suitable passivation insulation is applied.

Figure 6:
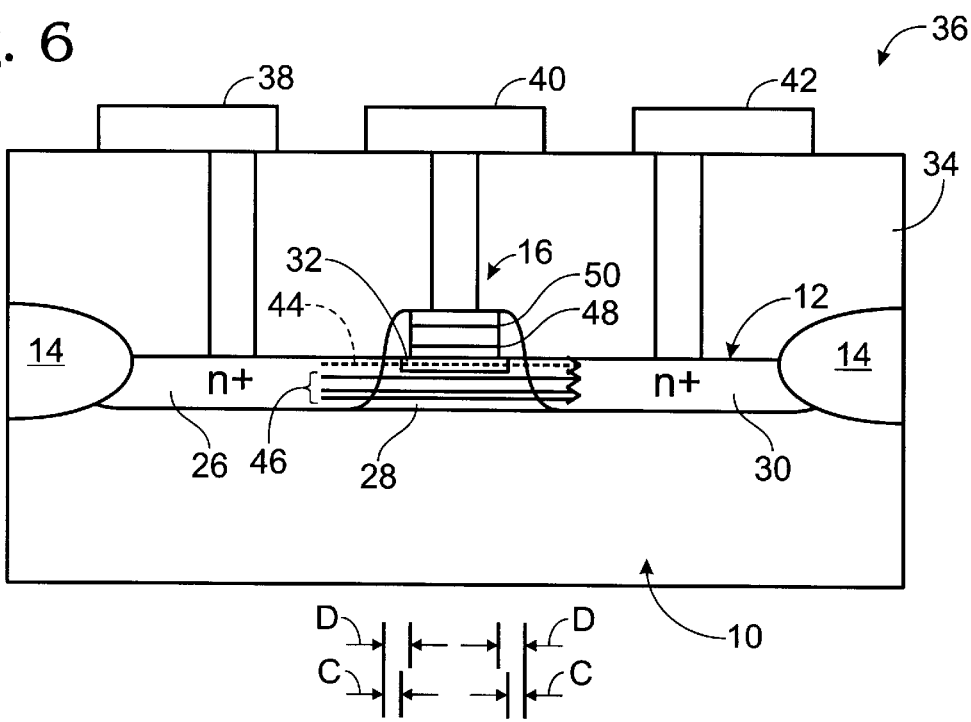
FIG. 6 depicts the completed FEM cell of the invention, and also depicts current flow therethrough.

Turning now to FIG. 6, FEM gate unit 16 is depicted as part of a FEM memory cell 36, which includes FEM gate unit 16 and the underlying source, channel and drain regions, which embodiment includes a thin shallow junction region 32, which is a $p^-$ layer, formed under FEM gate unit 16.

To complete the description of FEM cell 36, bores are formed in oxide layer 34 to receive a source electrode 38, a gate electrode 40 and a drain electrode 42 which are connected to their respective components.

The embodiment depicted in FIG. 6 represents a ferroelectric gate depletion-type MIS transistor. At zero gate voltage, the charge in the $n^-$ channel underlying the FEM gate unit is completely depleted. Accordingly, the leakage current is very small. In order to maintain the small leakage, the distance between any edge of lower electrode 18 and the edges of the $n^+$ source or $n^+$ drain regions, represented by "D", has to be at least 50 nm in order that the leakage current remain small. However, as D increases, the series resistance of the memory cell also increases. It is therefore preferred that D be no larger than 300 nm. The gate leakage current is determined by the p⁻ type silicon shallow junction 32 and the platinum to ferroelectric material contact. The potential barrier between the platinum and n⁻ type silicon is 0.9 eV. The potential barrier between the p⁻ conductive layer of the third type 32 and the n⁻ conductive layer of the first type 28 is also on the order of 0.9 eV. A potential barrier of this magnitude causes the n⁻ type silicon channel to be completely depleted when the ferroelectric material is not polarized. When the ferroelectric material is polarized with positive charge at the lower electrode interface 48, the threshold voltage is small. When the ferroelectric material is polarized with a negative charge at the lower electrode interface 48, the threshold voltage of the memory transistor is very large. The nature of these memory charges and techniques for changing the amount of voltage necessary to program the cells will be described later herein.

Diffusion of implanted B or $BF_2$ ions into the gate junction region is controlled to maintain a distance "C" between any edge of shallow junction layer 32 and the source and drain regions. In the preferred embodiment, "C" is between about 0 nm and 300 nm. The shallow junction structure serves to provide a reliable potential barrier between gate region 28 and the conducting channels for low leakage current and provides an efficient switching mechanism for the FEM cell of the invention.

Alternately, the source/drain ion implantation and annealing may be completed before the deposition of the lower gate electrode, if the ferroelectric material is unable to sustain high temperature heat treatment.

Operation

The structure constructed according to the invention is particularly efficient because the FEM gate unit, located over the conductive channel on the gate region, is able to shift the polarity of the gate region, allowing efficient current flow from the source through the channel to the drain. The structure provides a total charge depletion when in an "off" condition. FIG. 6 also depicts typical, prior art current flow, represented by dashed line 44, wherein the current flows through gate region 28 only directly below the FEM gate unit. This is because known FEM cell configurations are surface-inversion type structures, while the device disclosed herein is of the depletion type. The operating theory of a depletion-type device is similar to that of a junction FET. Solid lines 46 depict current flow through the device of the invention, where current may flow through the entire gate region below junction 32.

Memory cells constructed according to the invention may be placed in an array of memory cells such that the gate lines run perpendicular to the drain lines. When a negative voltage, $-V_{P0}$, is applied to the gate electrode 40 (program line), and a positive voltage, $+V_{P0}$ is applied to the drain 30, and the source 26 is grounded, and where $|V_{P1}|>|V_{P0}|$, the FE is polarized with a negative charge at lower electrode interface 48. This places FEM gate unit 16 in a low conductive state. (see FIG. 7a). The write process enables each memory transistor in a memory array to be written to independent of other memory cells in the array, with no interference to the other memory cells in the array.

In order to write to FEM gate unit 16, $+V_{P1}$ is applied to all gate electrodes 40, while the source electrodes 38 and drain electrodes 42 of the memory cell are at the ground potential. This polarizes FE 20 such that a positive charge is located at lower electrode interface 48 and a negative charge is located at upper electrode interface 50. (See FIG. 7b). This places FEM gate unit 16 in a high conductive state.

The threshold voltage for FEM gate unit 16 may be determined as follows: for a large scale array the threshold voltage at the "1" state has to be a small positive value, i.e., 0.4V to 0.8V. The threshold voltage for the "0" state has to be larger than the supply voltage, i.e., 3.3 V. The n⁻ channel layer is depleted by the p⁻ type substrate junction as well as by the very shallow p⁻ surface layer and the gate bias voltage. It can be shown that the memory window is equal to:

$$\Delta V_T = \frac{2Q_{FE}}{C_{FE}} \quad (1)$$

where $Q_{FE}$ is the remnant charge and $C_{FE}$ is the ferroelectric capacitance of the gate unit.

During a read operation, a voltage, $V_a$, of no larger than the coercive voltage, i.e., the voltage where the memory content may change, is applied to the gate electrode and the drain electrode. Because the content of the memory cell is not disturbed when any electrode is biased with $V_a$, the read operation will not disturb the memory contents of any memory cell. Therefore, a long charge retention is obtained.

A One Transistor Memory Cell

The general $I_D$ vs. $V_G$ plot for the MFMS FET is depicted in FIG. 8. FIG. 8a depicts the $I_D$ vs. $V_G$ characteristics of a FEM cell with high channel doping, $N_D$. The centerline is the $I_D$ vs. $V_0$ curve when the FEM gate unit is not charged. When the FEM cell is programmed to a "1" state, the threshold voltage of the FEM cell is negative. Thus, a large drain current may flow through the channel region even if $V_G=0V$. Such a device is not suitable for large scale array applications.

FIG. 8b depicts the $I_D$ vs. $V_G$ characteristics of a FEM cell with low channel doping $N_D$. The threshold voltage of the FEM cell when it is programmed to a "1" state is positive. No current may flow through the device when the gate is at ground potential. A large scale memory array of such devices will have a very small standby leakage current.

Ferroelectric $Pb_5Ge_3O_{11}$ Thin Film for MFMS Applications

It can be shown that the lower ferroelectric capacitance results in higher memory window and lower programming voltage. Thicker film and lower $\epsilon_r$ material can result in lower ferroelectric capacitance; however, the former choice could increase the programming voltage. Oxide $Pb_5Ge_3O_{11}$ thin film has very low $\epsilon_r$ and moderate $T_c$ (178° C.). Even though the steady state polarization for $Pb_5Ge_3O_{11}$ thin film is much lower than that for PZT and $SrBi_2Ta_2O_9$ films, the memory window for $Pb_5Ge_3O_{11}$ gate controlled MFMS device is larger than its counterparts due to its low $\epsilon_r$.

Thus, a FEM memory cell, and a method of constructing same has been disclosed. The FEM gate unit may be constructed as a single transistor device, or it may be constructed with an associated MOS transistor. Although a preferred embodiment of the invention has been disclosed, it should be appreciated that further variations may be made to the architecture and method without departing from the scope of the invention as defined in the appended claims.

We claim:

1. A method of forming a semiconductor structure having a ferroelectric memory (FEM) gate unit on a silicon substrate, comprising:

forming a silicon device area for the FEM gate unit;

implanting doping impurities of a first type in the silicon device area to form a conductive channel of a first type for use as a gate junction region;

depositing an FEM gate unit over the gate junction region, including depositing a lower metal layer, a FE layer and an upper metal layer, wherein the FEM gate unit is sized on the gate junction region such that any edge of the FEM gate unit is a distance "D" from the edges of the source junction region and the drain junction region, where "D" is between about 50 nm and 300 nm;

depositing an insulating structure about the FEM gate unit;

implanting doping impurities of a second type in the silicon device area on either side of the gate junction region to form a conductive channel of a second type for use as a source junction region and a drain junction region;

forming a conductive channel of a third type on the gate junction region, wherein the conductive channel of the third type is sized on the gate junction region such that any edge of the conductive channel of the third type is a distance "C" from the edges of the source junction region and the drain junction region, where "C" is between about 0 nm and 300 nm.

2. The method of claim 1 wherein forming a conductive channel of the third type includes implanting a dopant taken from the group consisting of B or $BF_2$ at an energy in a range of 3 keV to 10 keV or 15 keV to 50 keV, respectively, and a dose of $1 \cdot 10^{11}$ cm$^{-2}$ to $1 \cdot 10^{13}$ cm$^{-2}$.

3. The method of claim 1 which includes annealing the structure at a temperature of about 500° C. to 1100° C. to diffuse B or $BF_2$ ions from the lower metal layer into the gate junction region to form the conductive channel of the third type.

4. The method of claim 1 wherein said depositing the FEM gate unit includes depositing a lower metal layer of material taken from the group consisting of Pt, Ir, $IrO_2$ and Pt/Ir alloy, having a thickness of about 20 nm to 100 nm, depositing a FE layer of material taken from the group consisting of Pb(Zr, Ti)$O_3$ (PZT), $SrBi_2Ta_2O_9$ (SBT), $Pb_5Ge_3O_{11}$, $BaTiO_3$ and $LiNbO_3$, having a thickness of about 50 nm to 400 nm, and depositing an upper metal layer of material taken from the group consisting of Pt, Ir, $IrO_2$ and Pt/Ir alloy, having a thickness of 20 nm to 100 nm.

5. The method of claim 1 wherein said implanting doping impurities of the second type includes doping the device area with ions taken from the group consisting of As, implanted at an energy of about 40 keV to 70 keV, and phosphorous, implanted at an energy of about 30 keV to 60 keV, the ions having a dose of about $1 \cdot 10^{15}$ cm$^{-2}$ to $5 \cdot 10^{15}$ cm$^{-2}$.

6. The method of claim 1 wherein said depositing an insulating structure about the FEM gate unit includes depositing a layer of insulating material taken from the group consisting of $TiO_x$ and $Si_3N_4$ over the FEM gate unit.

7. A method of forming a semiconductor structure having a ferroelectric memory (FEM) gate unit on a silicon substrate, comprising:

forming a silicon device area for the FEM gate unit;

implanting doping impurities of a first type in the silicon device area to form a conductive channel of a first type for use as a gate junction region;

depositing an FEM gate unit over the gate junction region, including depositing a lower metal layer of material taken from the group consisting of Pt, Ir, $IrO_2$ and Pt/Ir alloy, having a thickness of about 20 nm to 100 nm, a FE layer of material taken from the group consisting of Pb(Zr, Ti)$O_3$ (PZT), $SrBi_2Ta_2O_9$ (SBT), $Pb_5Ge_3O_{11}$, $BaTiO_3$ and $LiNbO_3$, having a thickness of about 50 nm to 400 nm, and an upper metal layer of material taken from the group consisting of Pt, Ir $IrO_2$ and Pt/Ir alloy, having a thickness of 20 nm to 100 nm, wherein the FEM gate unit is sized on the gate junction region such that any edge of the FEM gate unit is a distance "D" from the edges of the source junction region and the drain junction region, where "D" is between about 50 nm and 300 nm;

depositing an insulating structure about the FEM gate unit;

implanting doping impurities of a second type in the silicon device area on either side of the gate junction region to form a conductive channel of a second type for use as a source junction region and a drain junction region;

forming a conductive channel of a third type on the gate junction region, wherein the conductive channel of the third type is sized on the gate junction region such that any edge of the conductive channel of the third type is a distance "C" from the edges of the source junction region and the drain junction region, where "C" is between about 0 nm and 300 nm.

8. The method of claim 7 wherein forming a conductive channel of the third type includes implanting a dopant taken from the group consisting of B or $BF_2$ at an energy in a range of 3 keV to 10 keV or 15 keV to 50 keV, respectively, and a dose of $1 \cdot 10^{11}$ cm$^{-2}$ to $1 \cdot 10^{13}$ cm$^{-2}$ in the lower metal layer.

9. The method of claim 7 wherein forming a conductive channel of the third type includes implanting a dopant taken from the group consisting of B or $BF_2$ at an energy in a range of 3 keV to 10 keV or 15 keV to 50 keV, respectively, and a dose of $1 \cdot 10^{11}$ cm$^{-2}$ to $1 \cdot 10^{13}$ cm$^{-2}$ in the surface of the conductive layer of the first type.

10. The method of claim 7 which includes annealing the structure at a temperature of about 500° C. to 1100° C. to diffuse B or $BF_2$ ions from the lower metal layer into the gate junction region to form the conductive channel of the third type.

11. The method of claim 7 wherein said implanting doping impurities of the second type includes doping the device area with ions taken from the group consisting of As, implanted at an energy of about 40 keV to 70 keV, and phosphorous, implanted at an energy of about 30 keV to 60 keV, the ions having a dose of about $1 \cdot 10^{15}$ cm$^{-2}$ to $5 \cdot 10^{15}$ cm$^{31\ 2}$.

12. The method of claim 7 wherein said depositing an insulating structure about the FEM gate unit includes depositing a layer insulating material taken from the group consisting of $TiO_x$ and $Si_3N_4$ over the FEM gate unit.

13. A ferroelectric memory (FEM) cell comprising:

a silicon substrate including an active region therein;

a gate junction region located in said active region, doped to form a conductive channel of a first type;

a source junction region and a drain junction region located in said active region on either side of said gate junction region, doped to form a pair of conductive channels of a second type;

a conductive channel of a third type located on said gate junction region;

a FEM gate unit including a lower metal layer, a FE layer and an upper metal layer; wherein said FEM gate unit overlays said conductive channel of said third type and has a surface area less than that of said conductive channel region of said third type, and is sized on the gate junction region such that any edge of said FEM gate unit is a distance "D" from the edges of said source junction region and said drain junction region, where "D" is between about 50 nm and 300 nm;

an insulating layer, having an upper surface, overlying said junction regions, said FEM gate unit and said substrate; and a source electrode and a drain electrode, each located on the upper surface of said insulating layer and extending therethrough to make electrical contact with their respective junction regions, and a gate electrode located on the upper surface of said insulating layer and extending therethrough to make electrical contact with the upper metal layer of said FEM gate unit.

14. The FEM cell of claim 13 wherein said conductive channel of said third type includes ions implanted therein, and wherein the ions are taken from the group consisting of B and $BF_2$, implanted at an energy in a range of 3 keV to 10 keV and 15 keV to 50 keV, respectively, and a dose of $1 \cdot 10^{11}$ $cm^{-2}$ to $1 \cdot 10^{13}$ $cm^{-2}$, which diffuse from the lower metal layer of said FEM gate unit during annealing of the structure at a temperature of about 500° C. to 1100° C.

15. The FEM cell of claim 13 wherein said FEM gate unit includes a lower metal layer of Pt, having a thickness of about 20 nm to 100 nm, a FE layer of material taken from the group consisting of $Pb(Zr, Ti)O_3$ (PZT), $SrBi_2Ta_2O_9$ (SBT), $Pb_5Ge_3O_{11}$, $BaTiO_3$ and $LiNbO_3$, having a thickness of about 100 nm to 400 nm, and an upper metal layer of material taken from the group consisting of Pt, Ir, $IrO_2$ and Pt/Ir alloy, having a thickness of 20 nm to 100 nm.

16. The FEM cell of claim 13 wherein said active region includes ions taken from the group consisting of As, implanted at an energy of about 40 keV to 70 keV, and phosphorous, implanted at an energy of about 30 keV to 60 keV, the ions having a dose of about $1 \cdot 10^{15}$ $cm^{-2}$ to $5 \cdot 10^{15}$ $cm^{-2}$.

17. The FEM cell of claim 13 wherein said conductive channel of said third type is constructed and arranged such that any edge thereof is a distance "C" from the edges of the source junction region and the drain junction regions, wherein "C" is between about 0 nm and 300 nm.

* * * * *